United States Patent
Uozumi

(10) Patent No.: US 8,349,718 B2
(45) Date of Patent: Jan. 8, 2013

(54) SELF-ALIGNED SILICIDE FORMATION ON SOURCE/DRAIN THROUGH CONTACT VIA

(75) Inventor: Yoshihiro Uozumi, Somers, NY (US)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/070,702

(22) Filed: Mar. 24, 2011

(65) Prior Publication Data

US 2012/0241963 A1    Sep. 27, 2012

(51) Int. Cl.
    *H01L 21/28* (2006.01)
(52) U.S. Cl. ........ 438/581; 438/583; 438/649; 438/655; 438/682; 257/E29.111
(58) Field of Classification Search .................. 438/581, 438/583, 649, 655, 682
    See application file for complete search history.

(56) References Cited

U.S. PATENT DOCUMENTS

| 2002/0033503 A1* | 3/2002 | Tseng ........................ 257/344 |
| 2007/0141798 A1* | 6/2007 | Bohr ........................... 438/301 |
| 2009/0224287 A1* | 9/2009 | Shin et al. .................. 257/192 |

FOREIGN PATENT DOCUMENTS

| JP | 2004-031753 | 1/2004 |
| JP | 2005-079206 | 3/2005 |

* cited by examiner

*Primary Examiner* — Wai Sing Louie
(74) *Attorney, Agent, or Firm* — Turocy & Watson, LLP

(57) ABSTRACT

According to certain embodiments, a silicide layer is formed after the fabrication of a functional gate electrode using a gate-last scheme. An initial semiconductor structure has at least one impurity regions formed on a semiconductor substrate, a sacrifice film formed over the impurity region, an isolation layer formed over the sacrifice film and a dielectric layer formed over the isolation film. A via is patterned into the dielectric layer of the initial semiconductor structure and through the thickness of the isolation layer such that a contact opening is formed in the isolation layer. The sacrifice film underlying the isolation layer is then removed leaving a void space underlying the isolation layer. Then, a metal silicide precursor is placed within the void space, and the metal silicide precursor is converted to a silicide layer through an annealing process.

17 Claims, 7 Drawing Sheets

SELF-ALIGNED SILICIDE FORMATION ON SOURCE/DRAIN THROUGH CONTACT VIA

FIELD

Embodiments described herein generally relate to methods and structures for formation of a silicide layer in semiconductor structures.

BACKGROUND

Semiconductor structures and devices can contain metalized layers for forming interconnects between different regions of the structure. A pattern of trenches and vias can be patterned into a dielectric layer and inlaid with metal wire to fabricate a metalized layer. A silicide can be present and the bottom of vias formed in the metalized layer to facilitate the electrical contact between the metal wire and an underlying device layer of the semiconductor structure.

Semiconductor structures containing transistor devices have a gate electrode structure for applying an electrical potential to the transistor gate. Gate-last fabrication schemes can be employed where a dummy gate is provided and other elements required to form a transistor device are fabricated around the dummy gate. The dummy gate is removed and a functional gate structure is formed at a downstream point during fabrication. Formation of a functional gate structure typically requires high-temperature thermal processes such as densify annealing, post-nitridation annealing, and drive-in annealing. However, high-temperature processes can induce damage to some materials that can be present in the semiconductor structure including silicides.

DETAILED DESCRIPTION

According to one embodiment, an initial semiconductor structure has at least one impurity region formed on a semiconductor substrate, a sacrifice film formed over the impurity region and/or a region on the substrate without additional impurities, an isolation layer formed over the sacrifice film and a dielectric layer formed over the isolation film. A via is patterned into the dielectric layer of the initial semiconductor structure and through the thickness of the isolation layer such that a contact opening is formed in the isolation layer. Then, at least a portion of the sacrifice film underlying the isolation layer is removed leaving a void space underlying the isolation layer. Then, a metal silicide precursor is placed within the void space, and the metal silicide precursor is converted to a silicide layer through an annealing process.

Field effect transistors are formed on semiconductor substrates by forming a channel intermediate to impurity doped source/drain regions defining associated source and drain regions. The channel has a different conductivity type from the source/drain regions. Electrodes establish electrical contacts with the source and drain regions and a gate electrode applies a field effect potential to the channel region to control current through the channel. In the gate-last scheme of semiconductor fabrication, a dummy gate is formed on semiconductor substrate to establish a gate width for self-alignment of the source, drain and channel regions during fabrication. The dummy gate is removed and replace with conductive functional gate materials after the source and drain regions are fabricated.

Silicide is often present in contact with the source and drain impurity regions to facilitate electrical connection with those regions. Since the silicide is placed in close contact with the source and drain regions, the silicide can be formed early in the fabrication process prior to removal of the dummy gate. However, various high-temperature processes typically employed in fabrication of a functional gate electrode can cause silicide materials to reform or recrystallize in different phases. Reforming of silicide materials can occur due to exposure to high-temperature processes greater than about 400° C. after formation of the silicide material at less than about 400° C. As a result of the presence of different phases within the silicide material, the electrical resistance of the silicide can be undesirably increased and defects in the structure of the silicide can be introduced. High-temperature processes that can induce damage to silicide materials include densify annealing, post-nitridation annealing, and drive-in annealing.

Figure 1:
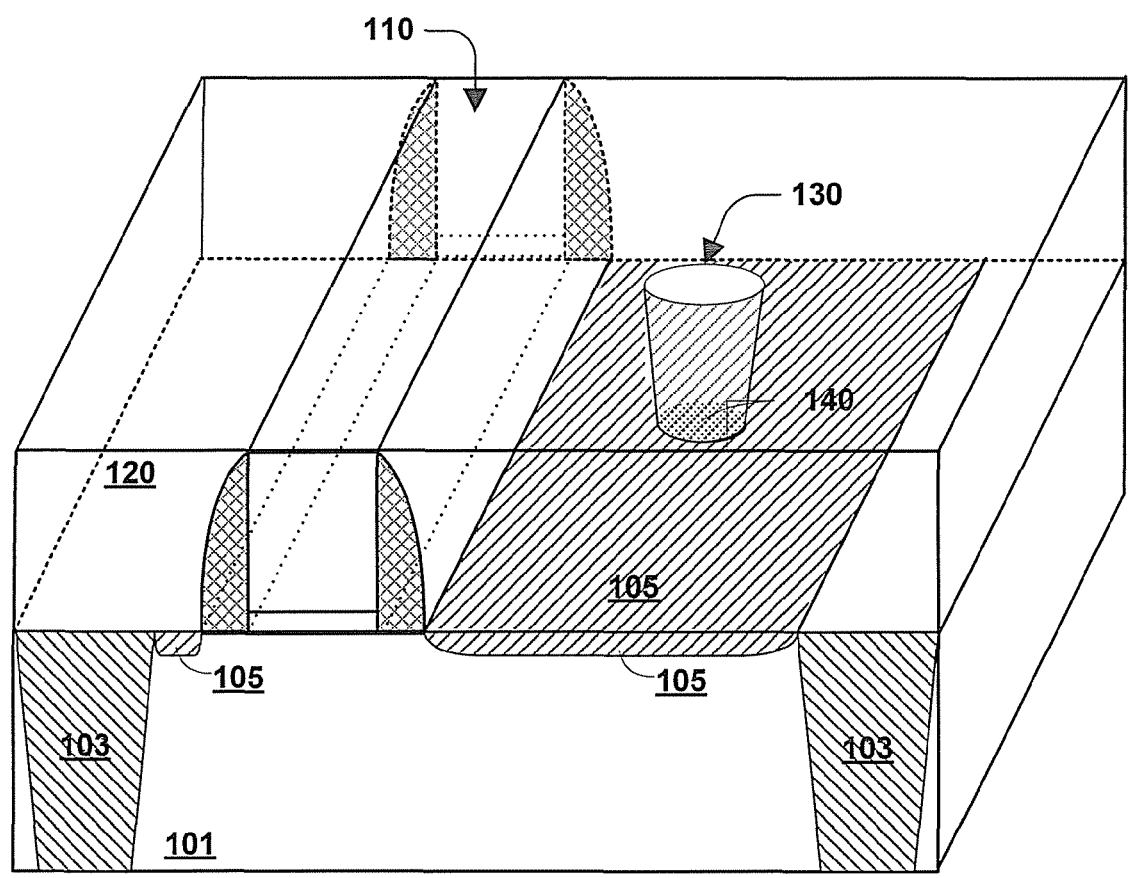
FIG. 1 shows a semiconductor structure having a silicide layer formed at the bottom of a via, where the silicide covers a portion of an impurity region.

In order to avoid damage to silicide materials due to high-temperature processes, the silicide material can be introduced after formation of a functional gate electrode. FIG. 1 shows a semiconductor structure having a gate structure 110 formed on a semiconductor substrate 101. Shallow isolation trenches 103 separate adjacent transistor devices having source/drain regions 105. A dielectric layer 120 is formed over the semiconductor substrate 101. The dielectric layer is processed to be a metalized layer for forming connections between different regions of the semiconductor substrate/wafer. A via and trench pattern can be formed in the dielectric layer 120 for the placement of a meal wire through known damascene and dual-damascene processes.

In FIG. 1, a via 130 is formed in the dielectric layer 120 to make contact with the source/drain region 105. After formation of the via 130, a silicide material 140 can be formed at the bottom of the via 130 to facilitate electrical contact between the source/drain region 105 and the wire to be placed within the via 130. However, the silicide material 140 only covers a small region of the source/drain region 105 equal to the size of the via 130. As such, electrical resistivity, contact resistance and interface resistance, is increased relative to structures where the silicide material covers a portion of the source/drain region greater than the area of the via.

Figure 2:
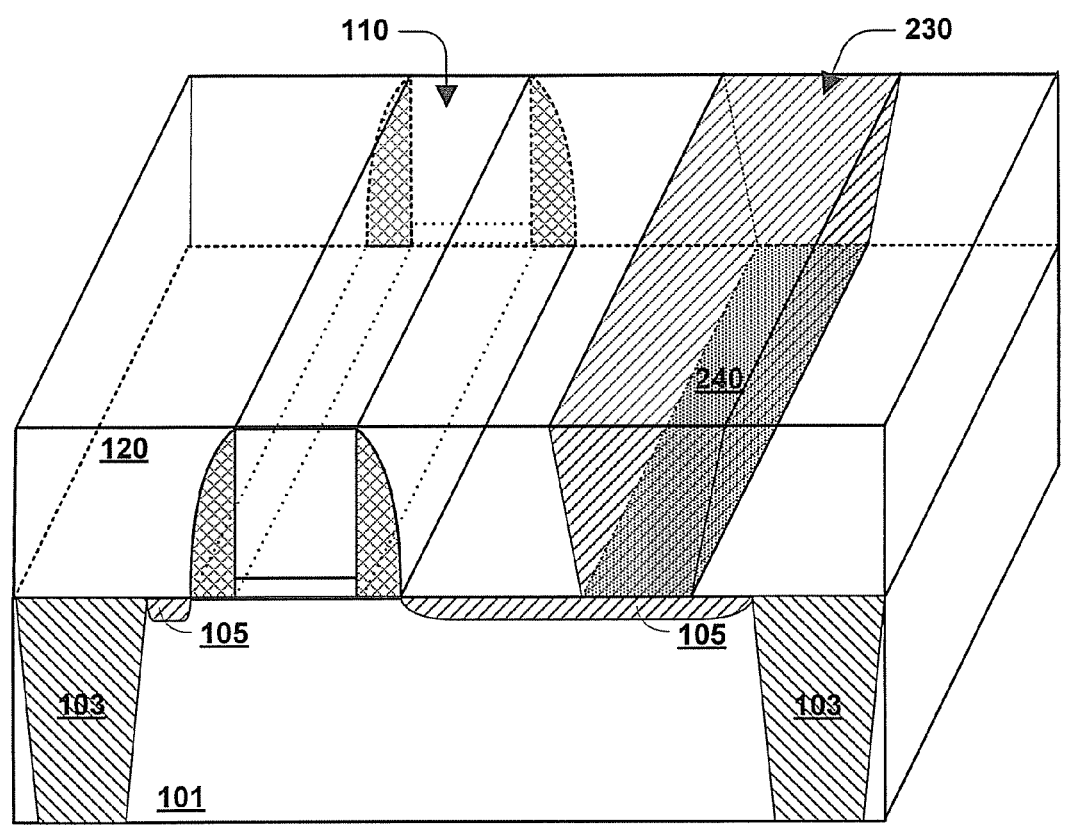
FIG. 2 shows a semiconductor structure having a silicide layer formed at the bottom of a via, where the silicide covers a majority of an impurity region.

FIG. 2 shows a semiconductor structure sharing some structural features with the semiconductor structure shown in FIG. 1. Same reference numbers indicate similar features. In FIG. 2, a via 230 is shown covering substantially the entire area of the source/drain region 105. As such, a silicide material 240 can be placed over substantially the entire surface of the source/drain region 105. However, the use of a via 230 of such large size requires additional patterning, filling, planarization and contact formation steps, which add significantly to fabrication costs. Further, the possibility of shorts occurring between the wire filling the via 230 and the gate structure 110 increases sharply when using a large via.

In embodiments disclosed herein, methods and structures are disclosed having the following features: 1) a silicide material is formed after removal of a dummy gate electrode and fabrication of a functional gate electrode; and 2) an area of the silicide is larger than an area of a via making contact with the silicide material. As such, the silicide material is not exposed to high-temperature processes.

Those skilled in the art will recognize that well-known semiconductor fabrication techniques including depositing materials, masking, photolithography, etching, and implanting are useful in forming the described devices or structures. Deposition of materials for forming semiconductor structures can be by low pressure chemical vapor deposition, chemical vapor deposition, atomic layer deposition, and the like. Conserved reference numbers match like elements.

Terms, such as "on," "above," "below," and "over," used herein, are defined with respect to the plane defined by the surface of a semiconductor substrate. The terms "on," "above," "over," etc. indicate that the subject element is farther away from the plane of the semiconductor substrate than another element referred to as a spatial reference. The term "below" and similar terms indicate that the subject element is closer to the plane of the semiconductor substrate than another element referred to as a spatial reference. The terms "interposed," "intermediate" and similar terms indicate that the subject element is located between two other elements referred to a spatial reference in reference to distance to the plane of the semiconductor substrate. The terms "on," "above," "below," and "over," "interposed," "intermediate," etc. only indicate a relative spatial relationship and do not necessarily indicate that any particular elements are in physical contact. The term "thickness" refers to the dimension of a feature in the direction perpendicular to the plane of the semiconductor substrate. The preceding definitions apply throughout this document. As used throughout this document, similar reference numbers refer to similar structures and features.

Figure 3:
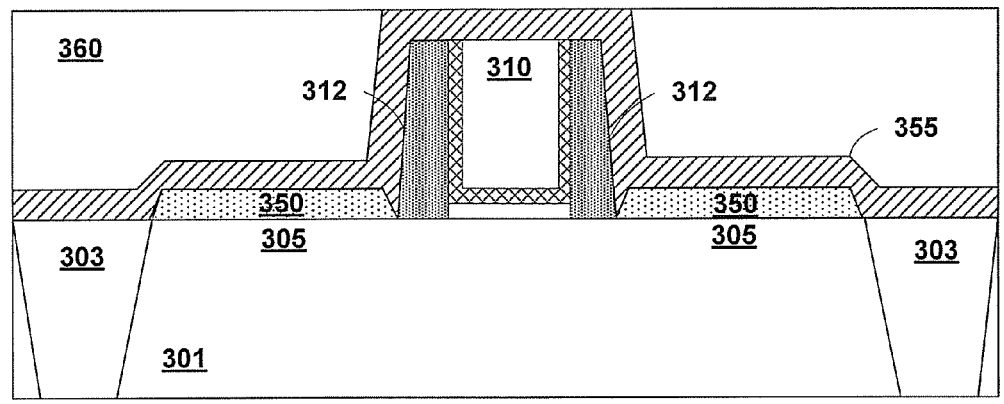
FIG. 3 shows an embodiment semiconductor structure having a sacrifice film formed over an impurity region.

Embodiments of the innovations disclosed herein will now be described with references to the Figures. FIG. 3 shows a semiconductor structure formed on a semiconductor substrate 301. In one embodiment, the semiconductor structure has a functional gate electrode structure 310 with sidewalls 312 formed thereon and has source/drain regions 305 doped with appropriate N- or P-type impurities. In another embodiment, source/drain regions 305 can have SiGe and/or SIC. Shallow trench isolation regions 303 separate adjacent transistor regions that may be formed on the same substrate 301.

A sacrifice film 350 is present over substantially all of the needed surface area of the semiconductor substrate 301 forming the source/drain regions 305. In one embodiment, the sacrifice film 350 is a substantially pure Ge layer or a SiGe layer having a high concentration of Ge equal to or greater than about 50% by weight of Ge. In another embodiment, the sacrifice film 350 is a SiGe layer having a low concentration of Ge less than about 50% by weight of Ge. In yet another embodiment, the sacrifice film 350 is a substantially pure Si layer or impurity doped Si layer. The sacrifice film 350 is a dummy film that can be removed by selective wet or dry etching relative to surrounding materials. The sacrifice film 350 can be formed on the source/drain regions 305 by any suitable method including by epitaxy growth. In one embodiment, the thickness of the sacrifice film is from about 5 to about 100 nm. In another embodiment, the thickness of the sacrifice film is from about 15 to about 50 nm.

The sacrifice film 350 can be deposited with known techniques, such as epitaxial growth, chemical vapor deposition, physical vapor deposition and plating. Especially, the epitaxial growth technique can deposit the sacrifice film 350 selectively on the source/drain regions 305.

The sacrifice film 350 is encapsulated in an isolation layer 355. The isolation layer 355 can be any suitable dielectric material including a silicon oxide and a silicon nitride. Those skilled in the art will understand that other materials can be used as the isolation layer 355. The sacrifice film 350 is selectively removed at a greater rate by etching compared to the isolation layer 355. As shown in FIG. 3, the semiconductor substrate 301 including the gate structure 310 is covered by a dielectric layer 360. The dielectric layer 360 can be silicon dioxide or a low-k material having a dielectric constant less than the dielectric constant of silicon oxide.

Figure 4:
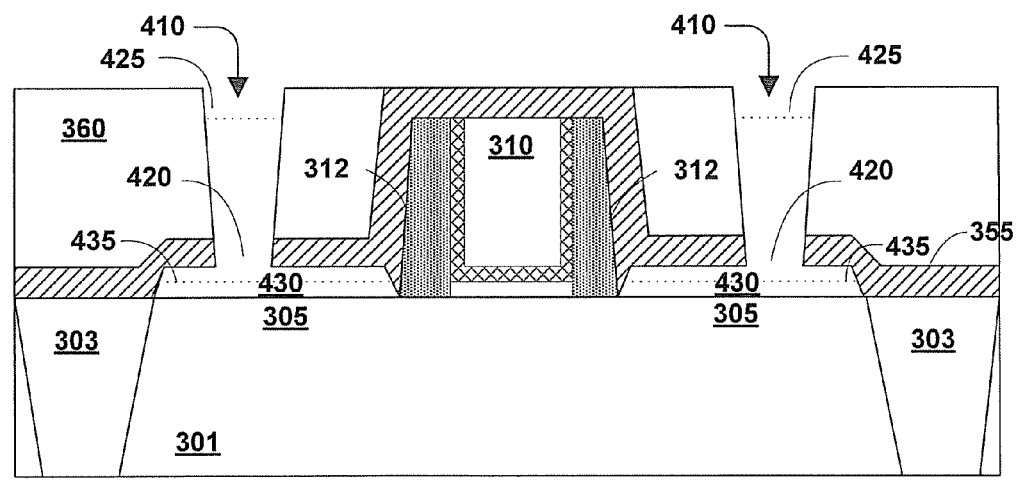
FIG. 4 shows an embodiment semiconductor structure having a sacrifice film removed thereby forming a void.

In FIG. 4, the structure shown in FIG. 3 is processed to have a via and/or a trench pattern formed in dielectric layer 360. Those skilled in the art will understand that dielectric layer 360 can be processed to have any appropriate trench and/or via pattern formed therein. For the purpose of demonstrating the advantages of innovations disclosed herein, vias 410 are shown formed in dielectric layer 360 and trenches are not illustrated. Vias 410 are formed by etching the dielectric layer 360 using any appropriate technique including plasma etching and reactive ion etching. During formation of the vias 410, a contact opening 420 is formed in the isolation layer 355.

After formation of the vias 410 and contact opening 420, the sacrifice film 350 is selectively removed through an appropriate etching process such that the no substantial change occurs to the vias 410 and the contact opening 420. In one embodiment, sacrifice film 350 is removed through a wet etching process. In embodiments where sacrifice film 350 is formed from pure Si or a SiGe layer having a low concentration of Ge, the sacrifice film 350 is removable by wet etching with an aqueous solution containing a base chemical and having a pH greater than about 9. For example, the aqueous solution can contain ammonia, tetramethylammonium hydroxide, tetraethylammonium hydroxide, choline, or an amine group-containing compound. In embodiments where sacrifice film 350 is formed from pure Ge or a SiGe layer having a high concentration of Ge, the sacrifice film 350 is removable by wet etching with an aqueous solution containing a peroxide with or without a base compound. Exemplary peroxides include hydrogen peroxide and an organic molecule containing a peroxide functional group. Exemplary base compounds include ammonia, tetramethylammonium hydroxide, tetraethylammonium hydroxide, choline, and amine group-containing compounds, as described above. Those skilled in the art will recognize that other reagents for wet etching can be used to remove sacrifice film 350. In another embodiment, the sacrifice film is removed by a dry chemical etching process.

After the selective removal of the sacrifice film 350, a void space 430 is formed under the isolation film 355. In the structure shown in FIG. 4, via 410 is formed in dielectric layer 360 leading to contact opening 420 and void space 430. As such, a feature of the structure shown in FIG. 4 is the void space 430 having similar or larger dimensions than the contact opening 420.

Figure 5:
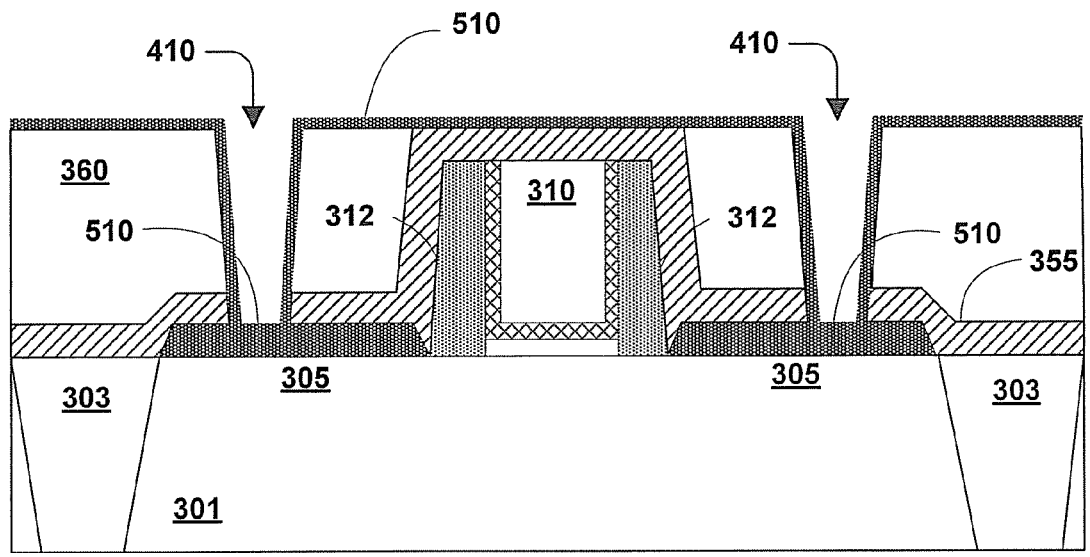
FIG. 5 shows an embodiment semiconductor structure having a metal silicide precursor material formed over an impurity region.

In the structure shown in FIG. 5, a metal silicide precursor 510 is placed within the void space 430. Exemplary metal silicide precursors include at least one or more from titanium, cobalt, nickel, platinum, tungsten and alloys thereof. Those skilled in the art will recognize that other metals and metal alloys can be employed as precursor material for forming a silicide. The metal silicide precursor 510 can be placed within the void space 430 through any appropriate technique including plating, chemical vapor deposition and atomic layer deposition. Deposition of the metal silicide precursor 510 is performed such that the void space 430 is filled with the metal silicide precursor with an appropriate thickness. As illustrated in FIG. 5, the metal silicide precursor is deposited on the surface of the dielectric layer 360 and along the via 410 during deposition of the metal silicide precursor. Deposition of metal silicide precursor material in areas outside of the void space 430 is incidental to the deposition process and not required to achieve the benefits described here.

Figure 6:
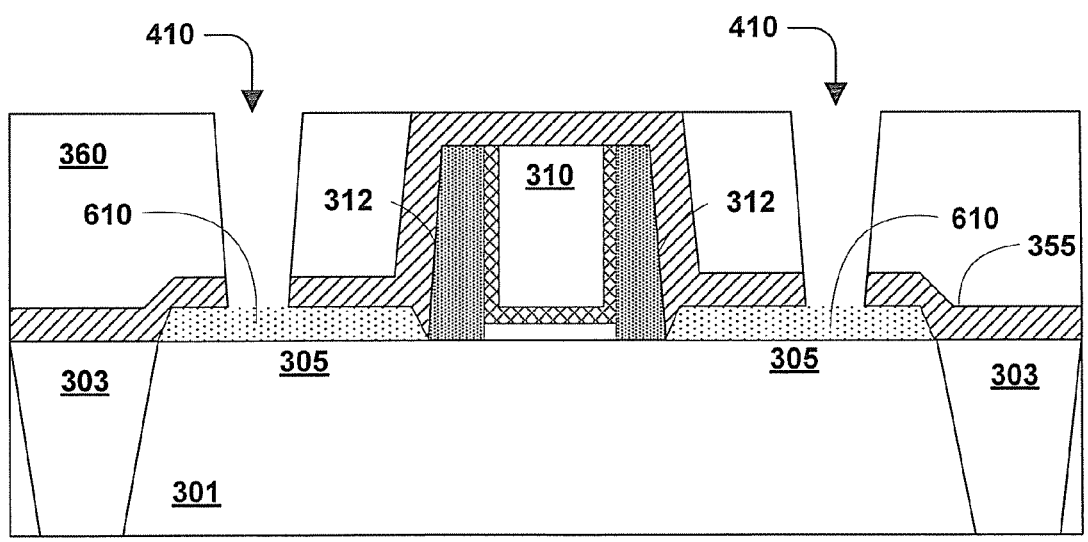
FIG. 6 shows an embodiment semiconductor structure having a silicide layer formed over an impurity region.

In FIG. 6, the metal silicide precursor 510 is converted to a silicide 610 by an annealing process. Annealing processes for conversion of a metal precursor to a silicide are known. Silicon atoms forming the silicide 610 originate from the semiconductor wafer 301. Metal silicide precursor 510 deposited on the surface of the dielectric layer 360 is stripped from the structure shown in FIG. 6. Metal silicide precursor that is not in contact with the semiconductor wafer 301 will typically not be converted into a silicide. Any appropriate technique can be used to remove unreacted metal silicide precursor deposited including wet stripping. Regents for removing the metal silicide precursor include mixtures containing acid and peroxide such as a mixture of sulfuric acid and peroxide. The metal silicide precursor does not need to be removed when the metal silicide precursor can be used for a barrier metal or a metal wire.

Figure 7:
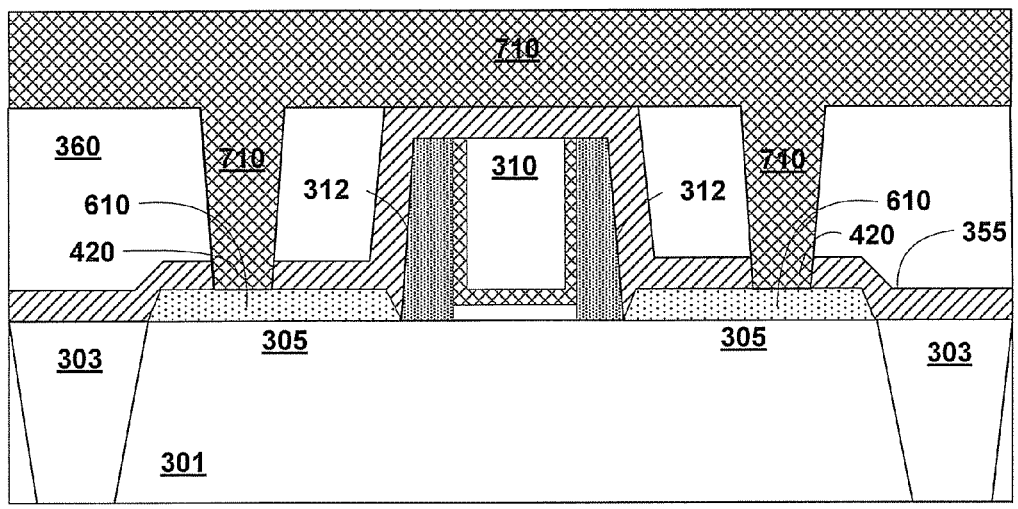
FIG. 7 shows an embodiment semiconductor structure having a silicide layer formed over an impurity region where the silicide is in contact with a metal wire formed in a via.
Figure 8:
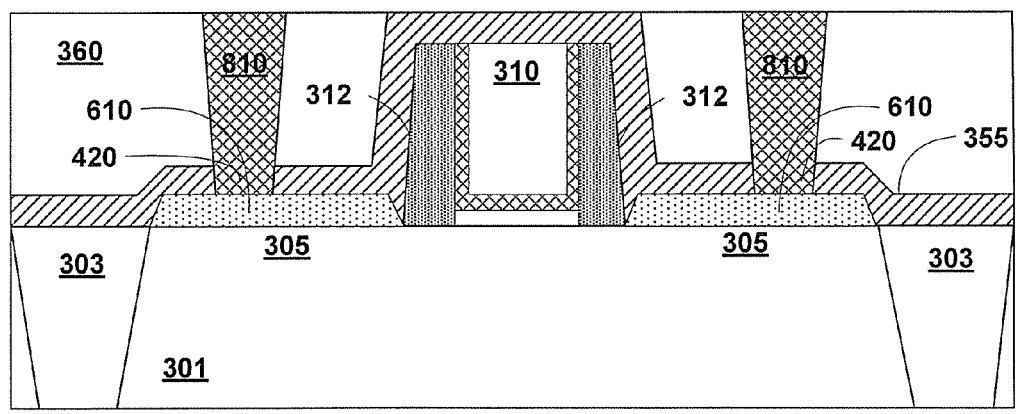
FIG. 8 shows an embodiment semiconductor structure having a silicide layer formed over an impurity region where the silicide is in contact with a metal wire formed in a via.

In FIG. 7, a metal wire 710 is deposited into the vias 410. The metal wire 710 can be placed using known plating, physical vapor deposition, chemical vapor deposition, damascene and dual damascene techniques. In one embodiment, the meal wire 710 contains copper or tungsten. A metal barrier layer (not shown) containing a transition metal can be present separating the metal wire 710 from the dielectric layer 360 to prevent diffusion of metal atoms, such as copper, in the metal wire 710 into the dielectric layer 360. In FIG. 8, the metal wire 710 is leveled using chemical mechanical polishing (CMP) to remove excess metal material to form a final metal wire 810. In one embodiment, the metal wire 810 contains copper or tungsten.

Figure 9:
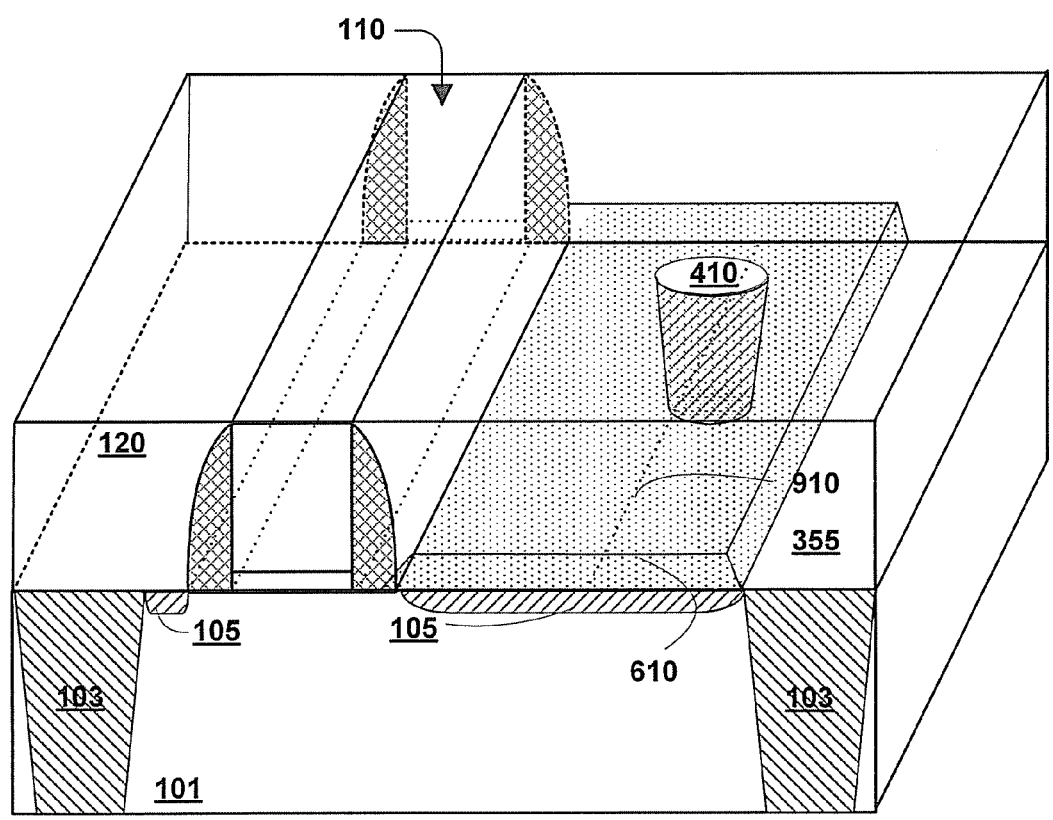
FIG. 9 shows an embodiment semiconductor structure having a silicide layer formed over a majority of impurity region, where an area of the silicide layer is larger than an area of a via making electrical contact with the silicide layer.

In FIG. 9, the properties of the semiconductor structure having a silicide layer are illustrated. In FIG. 9, a silicide layer 610 is shown for simplicity of illustration. Those skilled in the art will understand that in a typical structure has separate silicide layers 610 present adjacent to each side of the functional gate electrode 110. However, one silicide layer 610 is shown for purposes of illustration. An impurity region 105 that acts as a source or a drain region is shown implanted in the semiconductor substrate/wafer 101. For simplicity of illustration, part of the isolation layer 355 is shown in cutaway to allow the silicide layer 610 to be better illustrated. The silicide layer 610 covers substantially the entire impurity region 105. In one embodiment, the silicide layer 610 covers at least about 80% of the area of the impurity region 105. In another embodiment, the silicide layer 610 covers at least about 90% of the area of the impurity region 105. In yet another embodiment, the silicide layer 610 covers at least about 95% of the area of the impurity region 105.

The silicide layer 610 is contacted by a via 410 into which a metal wire is or can be placed. A contact hole 420, as shown in FIGS. 7-9, is present in the isolation layer 355 to allow for electrical communication between the silicide layer 360 and the via 410. As shown, the via 410 and the contact hole 420 are of similar although not necessarily identical size.

Through application of the innovations disclosed herein, the embodiment structure shown in FIG. 9 has a silicide layer 610 formed over substantially the entire area of the source/drain regions 105. The silicide layer 610 is formed after the fabrication of a functional gate electrode 110. Reforming of the silicide layer into different phases which have higher resistivity does not occur since exposure of the silicide layer to high-temperature processes to remove a dummy gate electrode and fabricate the functional gate electrode 110 is not required. Further, the via 410 for forming an electrical contact with the silicide layer 610 is not of a size that promotes electrical shorts between the via 410 and the gate electrode 110.

Figure 10:
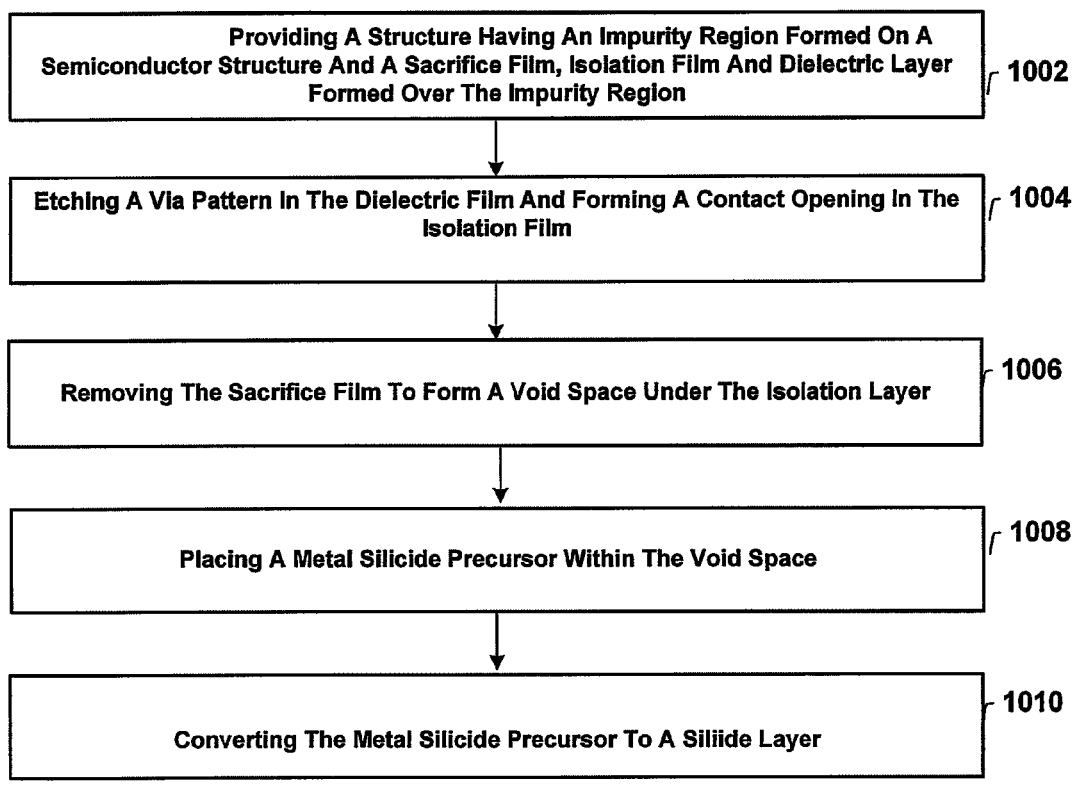
FIG. 10 shows a flow chart for an exemplary methodology for forming a silicide layer.

In order to fully describe the innovations disclosed herein, acts for forming a silicide layer with reference to FIG. 10. In act 1002, an initial semiconductor structure is provided having a semiconductor structure with an impurity region to serve as a source or a drain formed thereon. A sacrifice film is formed over the impurity region with an isolation layer and a dielectric layer further overlaying the sacrifice film. In act 1004, a via is formed in the dielectric layer and a contact opening is formed in the isolation layer. In act 1006, the sacrifice film is removed to form a void space under the isolation layer. In act 1008, a metal silicide precursor material is placed within the void space. In act 1010, the metal silicide precursor material is converted to a silicide layer through an annealing process.

With respect to any figure or numerical range for a given characteristic, a figure or a parameter from one range may be combined with another figure or a parameter from a different range for the same characteristic to generate a numerical range.

Other than in the operating examples, or where otherwise indicated, all numbers, values and/or expressions referring to quantities of ingredients, reaction conditions, etc., used in the specification and claims are to be understood as modified in all instances by the term "about."

While certain embodiments have been described, these embodiments have been presented by way of example only, and are not intended to limit the scope of the inventions. Indeed, the novel methods and devices described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A method for forming a self-aligned silicide, comprising:

provide an initial semiconductor structure comprising a semiconductor substrate having at least one impurity region, a sacrifice film formed over at least one of the impurity region or a region without additional impurities, and at least one dielectric layer formed over the sacrifice film;

forming a via pattern and a contact opening into the at least one dielectric layer;

removing the sacrifice film underlying the at least one dielectric layer leaving a void space underlying the at least one dielectric layer;

placing a metal silicide precursor within the void space; and converting the metal silicide precursor to a silicide layer.

2. The method of claim 1, wherein the at least one dielectric layer comprises at least one isolation layer formed over the sacrifice film and at least one dielectric layer formed over the isolation layer.

3. The method of claim 1, wherein the sacrifice film is removed by a wet etching process using an etching solution comprising one or more selected from the group consisting of hydrogen peroxide, a peroxide-containing compound and a base chemical.

4. The method of claim 1, wherein the sacrifice film comprises one or more selected from the group consisting of Ge, Si and SiGe.

5. The method of claim 1, wherein the metal silicide precursor comprises one or more selected from the group consisting of titanium, cobalt, nickel, platinum, tungsten and alloys thereof.

6. The method of claim 1, wherein the thickness of the silicide is from about 5 to about 100 nm.

7. The method of claim 1, wherein the silicide layer has an area larger than an area of the contact opening.

8. The method of claim 7, wherein the area of the silicide layer is at least about 30% larger than the area of the contact opening.

9. The method of claim 1, further comprising placing a metallic wire into the via pattern.

10. The method of claim 1, wherein the initial semiconductor structure further comprises a functional gate structure.

11. A method for making a semiconductor device, comprising:

providing a semiconductor structure comprising a semiconductor substrate having a functional gate structure formed on a semiconductor substrate, an impurity region formed on the semiconductor substrate, a sacrifice film formed over at least one of the impurity region or a region without additional impurities, and at least one dielectric layer formed over the sacrifice film;

etching a via pattern in the dielectric film and a contact opening in the at least one dielectric layer above the sacrifice film;

removing the sacrifice film to form void spaces under the at least one dielectric layer;

placing a metal silicide precursor within the void spaces; and annealing the metal silicide precursor to convert the metal silicide precursor to a silicide layer.

12. The method of claim 11, wherein the at least one dielectric layer comprises at least one isolation layer formed over the sacrifice film and at least one dielectric layer formed over the isolation layer.

13. The method of claim 11, wherein the sacrifice film comprises one or more selected from the group consisting of Ge, Si and SiGe.

14. The method of claim 11, wherein the metal silicide precursor comprises one or more selected from the group consisting of titanium, cobalt, nickel, platinum, and tungsten.

15. The method of claim 11, wherein the sacrifice film is removed by etching through contact with a composition comprising one or more selected from the group consisting of hydrogen peroxide, a peroxide-containing compound and a base chemical.

16. The method of clam 11, wherein the sacrifice film is removed by etching through contact with a composition comprising one or more selected from the group consisting of peroxide, ammonia, tetramethylammonium hydroxide, tetraethylammonium hydroxide, choline, and an amine group-containing compound.

17. The method of claim 11, further comprising placing a metallic wire into the via pattern such that an electrical contact is formed between the silicide layer and the metal wire through the contact opening.

\* \* \* \* \*